United States Patent
Hillis et al.

(10) Patent No.: US 7,053,809 B2
(45) Date of Patent: May 30, 2006

(54) ANALOG-TO-DIGITAL CONVERTER CIRCUITRY HAVING A CASCADE

(75) Inventors: W. Daniel Hillis, Encino, CA (US); Nathan P. Myhrvold, West Medina, WA (US); Lowell L. Wood, Jr., Livermore, CA (US)

(73) Assignee: Searete LLC, Bellevue, WA (US)

( * ) Notice: Subject to any disclaimer, the term of this patent is extended or adjusted under 35 U.S.C. 154(b) by 0 days.

(21) Appl. No.: 10/742,517

(22) Filed: Dec. 19, 2003

(65) Prior Publication Data

US 2005/0134489 A1 Jun. 23, 2005

(51) Int. Cl.
*H03M 1/12* (2006.01)

(52) U.S. Cl. ...................... 341/155; 330/310
(58) Field of Classification Search ............. 341/155, 341/118, 137, 139; 330/310; 250/226; 257/247; 438/70

See application file for complete search history.

(56) References Cited

U.S. PATENT DOCUMENTS

| | | | |
|---|---|---|---|
| 4,238,760 A | 12/1980 | Carr | |
| H000101 H | 8/1986 | Walker | |
| 4,823,129 A * | 4/1989 | Nelson | 341/139 |
| 4,945,242 A | 7/1990 | Berger et al. | |
| 5,216,384 A * | 6/1993 | Vanhecke | 330/279 |
| 5,286,990 A | 2/1994 | Hynecek | 257/247 |
| 5,561,287 A | 10/1996 | Turner et al. | |
| 5,854,574 A * | 12/1998 | Singer et al. | 330/293 |
| 5,864,146 A | 1/1999 | Karellas | |
| 5,965,875 A | 10/1999 | Merrill | 250/226 |
| 6,114,910 A * | 9/2000 | Goff | 330/289 |
| 6,246,345 B1 * | 6/2001 | Davidson et al. | 341/51 |
| 6,278,142 B1 | 8/2001 | Hynecek | 257/247 |
| 6,300,612 B1 | 10/2001 | Yu | |
| 6,395,576 B1 | 5/2002 | Chang et al. | |
| 6,501,400 B1 * | 12/2002 | Ali | 341/118 |
| 6,632,701 B1 | 10/2003 | Merrill | 438/70 |
| 2002/0003201 A1 | 1/2002 | Yu | |
| 2002/0030544 A1 * | 3/2002 | Kulhalli et al. | 330/301 |
| 2004/0119477 A1 * | 6/2004 | Kazemi-Nia | 324/500 |

FOREIGN PATENT DOCUMENTS

| | | |
|---|---|---|
| JP | 06319042 A | 11/1994 |
| JP | 2003-163556 A | 6/2003 |

OTHER PUBLICATIONS

Davidson, Michael W., Abramowitz, Mortimer, et al., "Digital Imaging in Optical Microscopy" at www.micro.magnet.fsu.edu/primer/digital imaging/digitalimagebasics.html; Printed on Feb. 23, 2004. pp. 1-17.

(Continued)

*Primary Examiner*—Peguy JeanPierre

(57) ABSTRACT

An analog to digital converter and/or related systems which in some aspects may contain but are not limited to: at least one cascade of N gain elements operably couplable with analog circuitry, and a gain element of the at least one cascade having a gain larger than one by an amount such that a noise factor of said at least one cascade operating on a predetermined operable signal at an input of said at least one cascade is substantially minimized.

41 Claims, 5 Drawing Sheets

OTHER PUBLICATIONS

Coates, Colin G.; Denvir, Donal J.; Conroy, Emer; McHale, Noel; Thornbury, Keith; Hollywood, Mark; "Back-illuminated electron multiplying technology: The world's most sensitive CCD for ultra low-light microscopy"; pp. 1-10, date unknown.

Black, Brian, Analog-to-Digital Converter Architectures and Choices for System Design, Analog Dialogue 33-8 (1999), pp. 1-4, no month.

Denvir, Donal J., et al., Electron Multiplying CCDs, Andor Technology Ltd. UK at www.andor-tech.com, 2003, no month.

Andor Technology Website link: Andor-tech.com\low light imaging\ixon\EMCCD—"The iXon CCDs featuring EM technology are the most sensitive imaging detectors ever!", Dec. 2003.

Foveon Brochure, copyright 2002 Foveon, Inc.—website: www.foveon.com, pp. 1-8, no month.

Lyon, Richard F., Foveon X3 Slides from Chief Scientist Richard F. Lyon's talks regarding Color Photography with Foveon X3 Sensor Technology, pp. 1-49. 2002, no month.

Coats, Colin G.; Denvir, Donal J.; Conroy, Emer; McHale, Noel; Thornbury, Keith; Hollywood, Mark; "Back-illuminated electron multiplying technology: The world's most sensitive CCD for ultra low-light microscopy"; pp. 1-10, date unknown.

PCT International Search Report; International App. No. PCT/US04/43025.

PCT International Search Report; International App. No. PCT/US04/41041; Sep. 22, 2005.

PCT International Search Report; International App. No. PCT/US04/41041; Sep. 22, 2005.

* cited by examiner

US 7,053,809 B2

ANALOG-TO-DIGITAL CONVERTER CIRCUITRY HAVING A CASCADE

TECHNICAL FIELD

The present application relates, in general, to analog to digital converter circuitry.

SUMMARY

In one aspect, a system having an analog-to-digital converter includes but is not limited to: at least one cascade of N gain elements operably couplable with analog circuitry, the at least one cascade having at least (a) N greater than or equal to a positive integer sufficient to provide the at least one cascade with a gain such that a predetermined operable signal at an input of the at least one cascade generates a signal at an output of the at least one cascade that is larger than a predetermined operable threshold value, (b) an input of a first gain element of the at least one cascade operably couplable with the analog circuitry, (b) a gain element of the at least one cascade having a gain larger than one by an amount such that the noise factor of the at least one cascade operating on the predetermined operable signal at the input of the at least one cascade is substantially minimized, and (d) one or more output value detection circuits respectively operably coupled with one or more outputs of the N gain elements.

In one aspect, a method of constructing a system having an analog to digital converter with N gain elements includes but is not limited to: configuring a first gain element such that an input of the first gain element is operable to receive an input signal; connecting an output of a k'th gain element to an input of a k+1'th gain element, wherein k is an integer that is at least 1; connecting one or more outputs of the N gain elements respectively to one or more value detection circuits; configuring an N'th gain element such that an output of the N'th gain element is operable to generate an output signal; and wherein N is such that the ratio between the output signal and the input signal is larger than a predetermined threshold gain when the input signal is received at the input of the first gain element.

In one aspect, a method of digitizing an input signal with N gain elements includes but is not limited to: receiving the input signal at an input of a first gain element; transmitting a signal from an output of a k'th gain element to an input of a k+1'th gain element, wherein k is an integer that is at least 1; transmitting signals from one or more outputs of the N gain elements respectively to one or more value detection circuits; generating an output signal at an output of an N'th gain element; and N being a positive integer such that a ratio between the output signal and the input signal is larger than a predetermined threshold gain.

In one or more various aspects, related systems include but are not limited to circuitry and/or programming for effecting the method aspects described in the text and/or drawings of the present application; the circuitry and/or programming can be virtually any combination of hardware, software, and/or firmware configured to effect the foregoing-referenced method aspects depending upon the design choices of the system designer.

In one aspect, a system including but not limited to: a photo-detector array having at least one output; and at least one cascade of N gain elements operably coupled with the photo-detector array, having at least (a) N greater than or equal to a positive integer sufficient to provide the at least one cascade with a gain such that a predetermined signal at an input of the at least one cascade generates a signal at an output of the at least one cascade that is larger than a predetermined threshold value, (b) an input of a first gain element of the at least one cascade operably coupled with an output of the photo-detector array, (c) a gain element of the at least one cascade having a gain larger than one by an amount such that the noise factor of the at least one cascade operating on the predetermined signal at the input of the at least one cascade is substantially minimized, and (d) one or more output value detection circuits respectively operably coupled with one or more outputs of the N gain elements.

In one aspect, a method of analog-to-digital conversion includes but is not limited to: detecting that a first gain element output of N gain elements in a cascade is below a first predefined threshold; and determining a digital conversion value in response to a detection that a second gain element output of the N gain elements in the cascade is above a second predefined threshold greater than the first predefined threshold.

In one aspect, a system having an analog-to-digital converter includes: at least one cascade of N gain elements operably couplable with analog circuitry, the at least one cascade having at least (a) N greater than or equal to a positive integer sufficient to provide said at least one cascade with a gain such that a predetermined operable signal at an input of said at least one cascade generates a signal at an output of said at least one cascade that is larger than a predetermined operable threshold value, (b) an input of a first gain element of said at least one cascade operably couplable with the analog circuitry, and (c) one or more output value detection circuits respectively operably coupled with one or more outputs of the N gain elements.

Various other method and or system aspects are set forth and described in the text (e.g., claims and/or detailed description) and/or drawings of the present application.

The foregoing is a summary and thus contains, by necessity; simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE FIGURES

The use of the same symbols in different drawings typically indicates similar or identical items

DETAILED DESCRIPTION OF THE FIGURES

Figure 1:
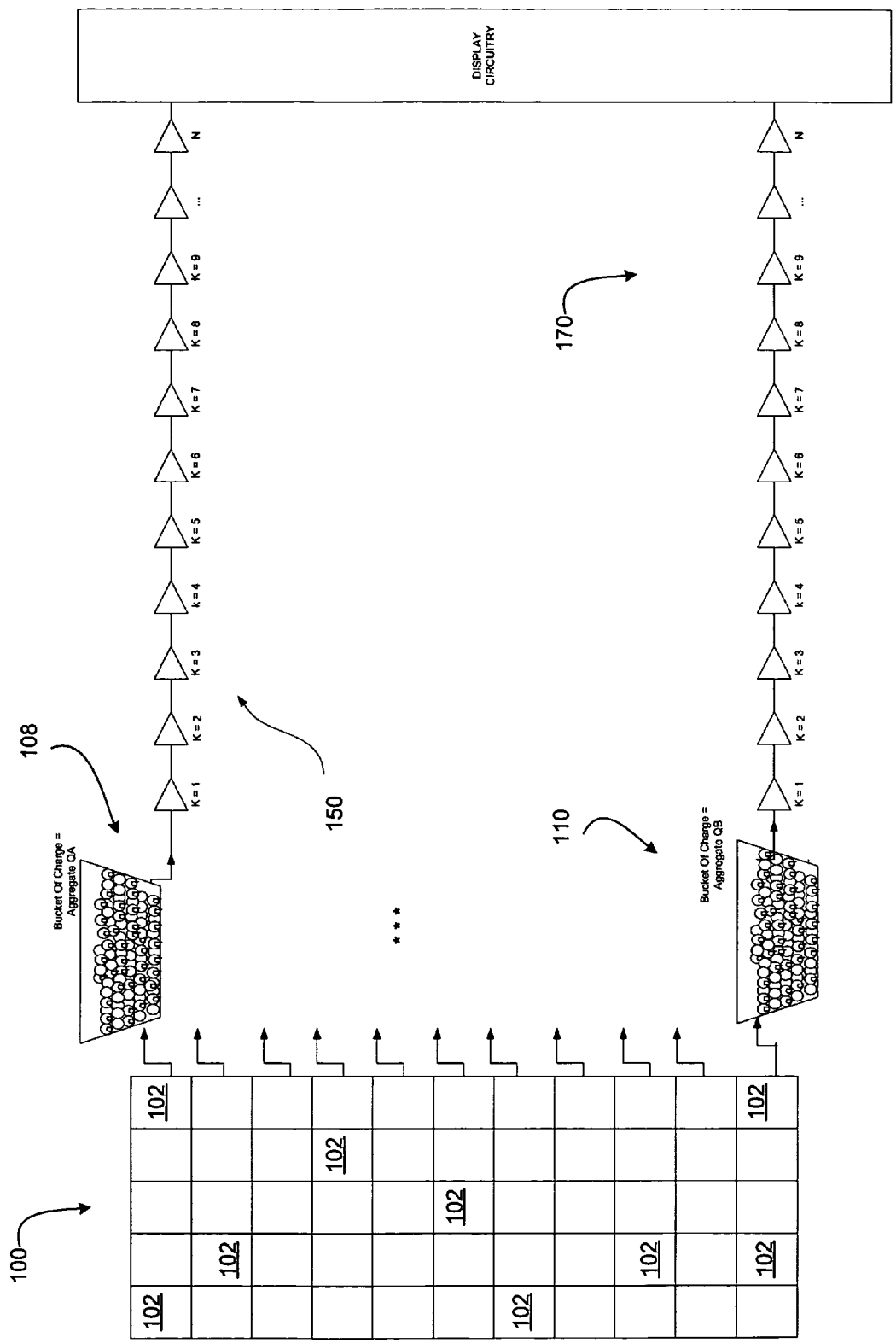
FIG. 1 depicts a system that may form an environment of subject matter described herein.

With reference to the figures, and with reference now to FIG. 1, depicted is a system that may form an environment of subject matter described herein. The system is depicted as including at least one photo-detector array 100. Functions of photo-detector array 100 may include absorption of photons, generation of electric charge corresponding to the photons absorbed, collection of such charge, charge transfer, and/or conversion of the charge to a corresponding voltage. Examples of photo-detector array 100 include but are not limited to charge coupled device (CCD) sensor arrays and complementary metal oxide semiconductor (CMOS) sensor arrays. Those having skill in the art will recognize other examples of photo-detector array 100 in view of the teaching herein.

Photo-detector array 100 is illustrated as having individual photo-detectors 102 arranged in a row and column format. For sake of illustration, photo-detector 100 is described herein using a shift register format, but those having skill in the art will appreciate that photo-detector array 100 is meant to be inclusive of substantially all suitable photo-detector arrays, including but not limited to Vertical, Linear, Interline, Full-frame, and Frame-transfer arrays.

In photo-detector array 100, each individual photo-detector 102 typically collects charges generated by incident photons over a defined interval (e.g., as an exposure time interval). The charges are often generated by incoming photons that excite electrons bound to atoms into an electronic conduction band. The number of charges so excited is sometimes directly proportional to the photon-count of the incoming light. At the end of the defined exposure time interval, the charges collected by each individual photo-detector 102 of photo-detector array 100 are shifted out of photo-detector 100 and into display circuitry 106. As a shorthand notation used for ease of understanding, each photo-detector 102 is described herein as collecting "buckets" of charge Q, where the buckets of charge are representative of received light. While examples are set forth herein in terms of charge buckets emerging from photo-detector array 100, those having skill in the art will appreciate that the teachings herein may be applied to voltage and or current-based configurations with a minor amount of experimentation. For example, the teachings herein may be applied to systems that include microphones, temperature detectors, thermocouples, etc. with minor amounts of experimentation.

Photo-detector array 100's rows of individual photo-detectors 102 are shown herein as acting in horizontal shift register fashion. Although each row is coupled with its own respective cascade 150 of N gain elements, only the first and last rows are explicitly illustrated as so coupled for brevity (ellipses in the drawings represent that all rows are so coupled). Specifically, different buckets 108, 110 of aggregate charges QA and QB—representative of charges collected by individual photo-detectors 102 over the defined exposure time—are illustrated as having been right-shifted out of the top and the bottom rows of photo-detector array 100. Those having skill in the art will appreciate that although photo-detector array 100 is shown as employing a shift-register (e.g., bucket brigade) type architecture, other architectures of photo-detector array 100 are contemplated. For example, some photo-detector arrays employ what are typically referred to as Active Pixel Sensor architectures which apply a readout amplifier to each pixel, allow for charge-to-voltage conversion at each individual pixel. Consequently, in another contemplated implementation each individual photo-detector 102 of photo-detector array 100 is respectively coupled to an individual cascade 150 of N gain elements, and display circuitry 106 is modified accordingly. In other contemplated implementations, amplifying circuitry may be placed elsewhere in a signal chain, providing for multiple gain stages throughout the system. Therefore, photo-detector 100 is intended to be representative of all the herein described types of photo-detector arrays, as well as other functionally similar ones recognized by those of skill in the art.

Different buckets 108, 110 of aggregate charge QA and QB are illustrated as having been shifted out of rows of photo-detector 100, where each bucket 108, 110 represents the aggregate charge "Q" collected by some photo-detector 102 over some period of time (e.g., an exposure time). The fact that each bucket 108, 110 contains an aggregate charge collected over time is depicted by the lowercase "q"s making up the uppercase "QA" sand "QB" in the buckets 108, 110. Buckets 108, 110 will typically contain different amounts of charge.

Buckets 108, 110, with aggregate charges QA and QB, are shown as outputs of photo-detector 100 applied to inputs of the respective cascades 150, 170 of k=1 to N gain elements. Although cascades 150, 170 are shown having N gain elements, such is not required. For instance, cascade 150 could have k=1 to J elements, where J is a different number than N.

Focusing now on cascade 170, the number N is preferably chosen to be greater than or equal to a positive integer sufficient to provide cascade 170 with a gain such that a predetermined operable signal at an input of cascade 170 generates a signal at an output of cascade 170 that is larger than a predetermined operable threshold value. For example, if the smallest operable output value of photo-detector 100 were known, and the smallest operable input signal value of display circuitry 106 were known, then N would preferably be chosen such that the gain of cascade 170 would be at least as large as that necessary to provide display circuitry with its smallest operable input signal value when photo-detector 100's output is at its smallest detectable value.

In one implementation the gain elements of cascade 170 preferably have a gain larger than one by an amount such that the noise factor of cascade 170 operating on the predetermined signal at the input of said at least one cascade is substantially minimized (e.g., having a noise factor at or near one, such as a noise factor less than 1.1 or 1.2). There are various ways in which the noise factor may be viewed. For instance, the noise factor may be viewed as the ratio of a Signal Power to Thermal Noise ratio at the input of said at least one cascade to an amplified Signal Power to Thermal Noise ratio at the output of the at least one cascade: $(S_{input}/N_{input})/(S_{output}/N_{output})$. Alternatively, the noise factor may be viewed as a ratio of an output noise power of the at least one cascade to the portion thereof attributable to thermal noise in an input termination at standard noise temperature. Alternatively again, the noise factor may be viewed as a ratio of actual output noise to that which would remain if the at least one cascade itself did not introduce noise. In one implementation, the gains of the gain elements in cascade 170 are chosen larger than one by an amount that is practicably small such that the noise contribution to the low noise amplifier from a gain element is substantially minimized. In one implementation, the N gain elements are preferably chosen to be very low gain amplifiers (e.g., gains greater than 1.00 (one) but less than 1.01 (one point zero one) or 1.001 (one point zero zero one) that produce very little additive noise. One example of such extremely low gain amplifiers that produce little additive noise are slightly over-biased amplifiers.

In one implementation, the N gain elements are preferably chosen to include one or more impact ionization-based amplifiers, such as those used in the Texas Instruments IMPACTRON CCDs (available from Texas Instruments Inc., Richardson, Tex., USA) or those used in the Marconi L3Vision CCDs (available from Marconi Applied Technology, United Kingdom). Such amplifiers can use a signal-boosting technique that may effectively reduce CCD read-out noise by a gain factor. Impact-ionization based amplifiers preferably use special high-voltage clocking which can both initiate and then sustain an impact ionization-process. When cascade 170 is implemented with such technologies, bucket 110 of charge can be multiplied such that greatly improved signal-to-noise ratio for signal levels in the vicinity of the photo-detector 100 read-noise floor may be achieved. In another implementation, the N gain elements are preferably chosen to include one or more low noise operational amplifiers.

Figure 2:
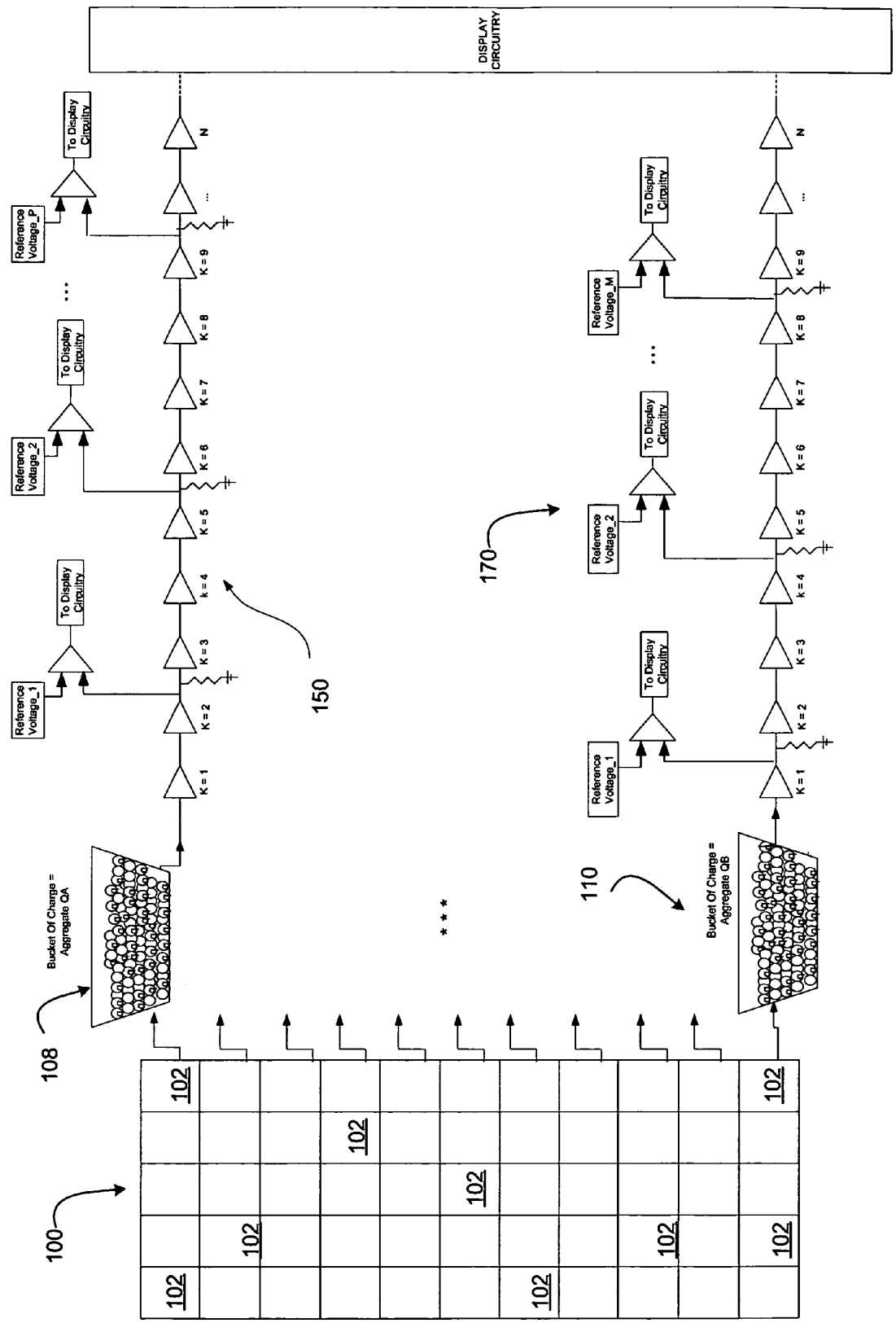
FIG. 2 shows the structure of FIG. 1 modified to provide analog-to-digital converters.

With reference now to FIG. 2, shown is the structure of FIG. 1, modified to provide analog-to-digital converters. Cascade 150 fed by bucket 108 of aggregate charge QA is shown having P attached voltage comparators. The inputs of gain elements having the attached comparators are also shown as having resistors connected to ground. These resistors are preferably large so as to draw as little current as is practicable. Each comparator is illustrated as having its own respective reference voltage depicted as reference voltage_1 through reference voltage_P. The respective comparators will trigger when the voltages across their respective resistors exceeds their respective reference voltages. In another embodiment (not shown) current comparators are used to directly sense the current.

Each comparator 1-P is depicted as having an output to display circuitry 106. Display circuitry 106 is shown as using the quantized output of the various comparators 1-P to augment the amplified value received from cascade 150 of gain elements. In one implementation, the comparators 1-P are such that display circuitry 106 may use the quantized output to provide a direct quantization and/or digital conversion; these alternate implementations are depicted in FIG. 2 by the dashed line connecting the Nth gain element with display circuitry 106, and are also shown and described further herein.

Cascade 170 fed by bucket 110 of aggregate charge QB is shown having M attached comparators. The inputs of gain elements having the attached comparators are also shown as having resistors connected to ground. These resistors are preferably large so as draw as little current as is practicable. Each comparator is illustrated as having its own respective reference voltage depicted as reference voltage_1 through reference voltage_M. The respective comparators will trigger when the voltages across their respective resistors exceed their respective reference voltages. In another embodiment (not shown) current comparators are used to directly sense the current.

Each comparator 1-M is depicted as having an output to display circuitry 106. Display circuitry 106 is shown as using the quantized output of the various comparators 1-M to augment the amplified value received from cascade 170 of gain elements. In one implementation, the comparators 1-M are such that display circuitry 106 may use the quantized output to provide a direct quantization and/or digital conversion; these alternate implementations are depicted in FIG. 2 by the dashed line connecting the Nth gain element with display circuitry 106, and are also shown and described further herein.

Continuing to refer to FIG. 2, and concentrating on cascade 170 fed by bucket 110 notice that since the N gain elements are cascaded, the signal will be less amplified near the first gain element and more amplified near the Nth gain element. Accordingly, if the reference voltages 1-M were all set to have the same value, and each of the N gain elements had about the same gain values, the comparator that triggered closest to the $1^{st}$ gain element would be indicative of the amount of charge, QB, input to cascade 170. For example, for some input bucket 110 of charge, if the second comparator, with reference voltage_2, triggered, but the first comparator with reference voltage_1 did not, the known gains of the stages could be used to infer the amount of charge QB. That is, it would be known that (a) QB×Gain of Element 1<ReferenceVoltage_1; and that (b) QB×(Gain of Element 1×Gain of Element 2×Gain of Element 3×Gain of Element 4)>Reference Voltage_2. Specifically, with both reference voltage_1 and reference voltage_2 arbitrarily chosen to have a value of 2, and the gains of the first, second third and fourth element all arbitrarily chosen as 1.01, the scheme would yield: QB×1.01<2=QB<1.98; and QB×(1.01×1.01×1.01×1.10)>2=QB>1.92. Thus, the structure indicates that 1.92<QB<1.98. Thereafter, QB can be further quantized and/or digitized by display circuitry 106 using conventional techniques. In other embodiments the comparators and resistors can be distributed for yet more precision (e.g., 1 for every gain element). In yet other embodiments, the comparators and resistors can be distributed and the voltage reference levels manipulated such that specified discrete changes in the amount of charge QB, thereby allowing the output of the comparators to function as direct digital output values.

Figure 3:
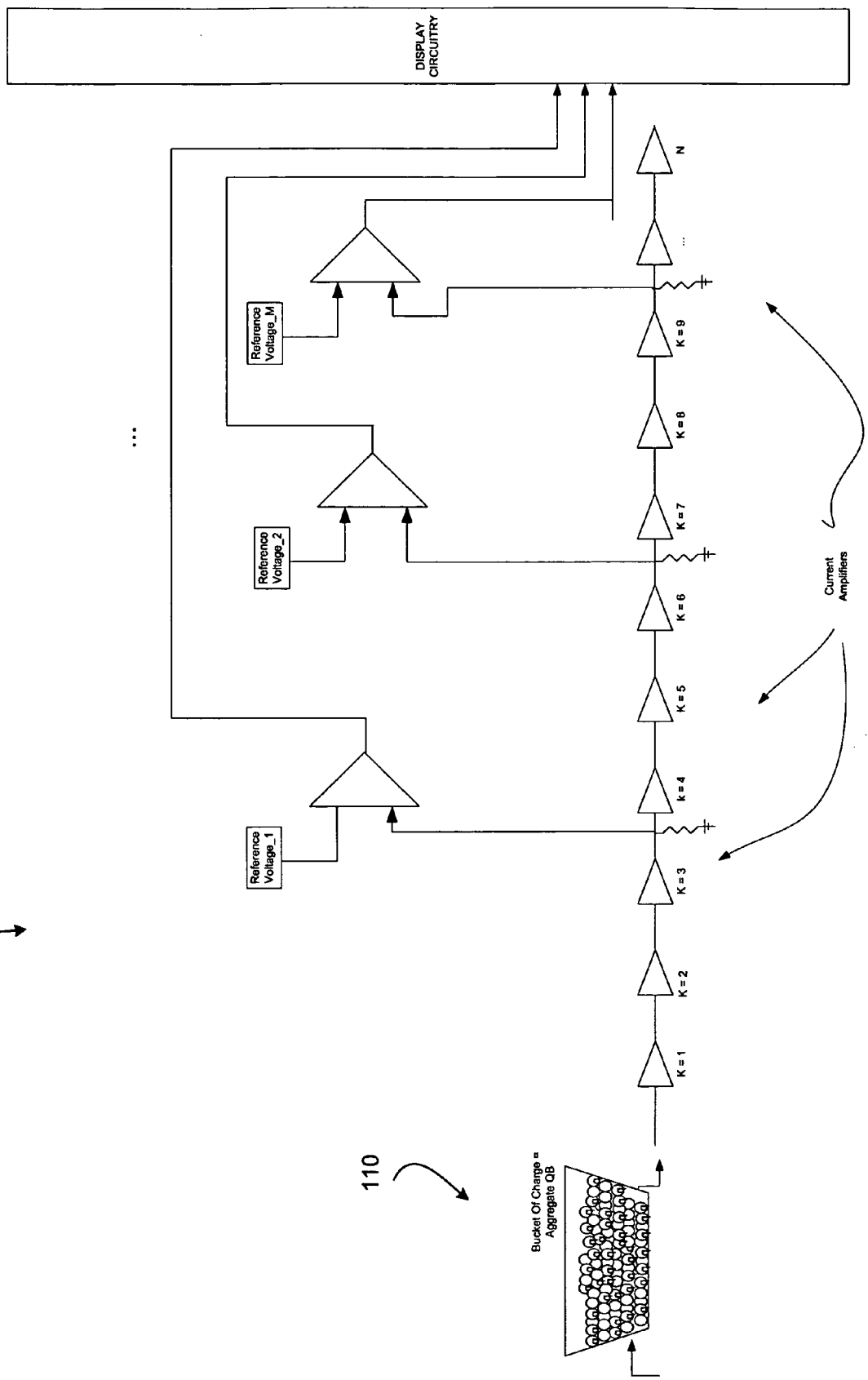
FIG. 3 illustrates a break out view of an alternate implementation of lower cascade 170 fed by bucket 110 as depicted in FIG. 2.

Referring now to FIG. 3, illustrated is a break out view of an alternate implementation of lower cascade 170 fed by bucket 110 as depicted in FIG. 2. Specifically, each of the resistors and comparators 1-M are shown respectively connected every $3^{rd}$ gain element. Comparators 1-M are depicted as connected to display circuitry 106, while gain element N is shown as not connected to display circuitry 106.

Assuming that the gain elements all have roughly the same gain, on this implementation, the display circuitry may directly use the comparator outputs to get direct digital conversion of the analog charge Q2 of bucket 110.

Figure 4:
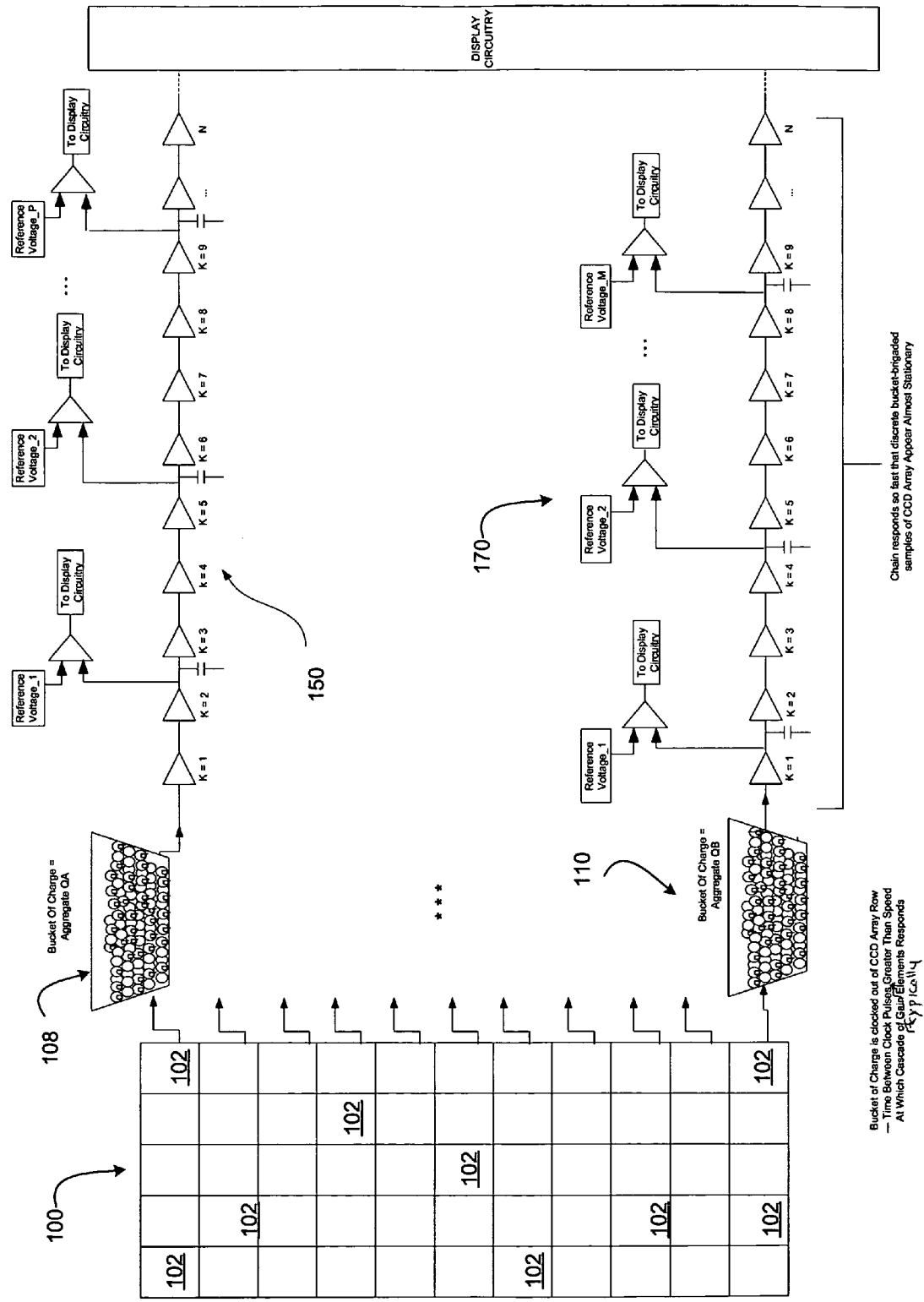
FIG. 4 shows an alternative embodiment of the structures of FIG. 2 wherein the resistors have been replaced by capacitances.

With reference now to FIG. 4, shown is an alternative embodiment of the structures of FIG. 2 wherein the resistors have been replaced by capacitances. One implementation in which the structures of FIG. 4 prove useful is that wherein the time interval between successive buckets of charge clocked into cascade 150 of N gain elements is greater than the time needed for cascade 170 to effectively settle. That is, in a circuit where cascade 170 responds so fast that cascade 170 will have effectively completed its response to bucket 110 of charge QB long before a next bucket of charge is shifted onto the input of cascade 170. As cascade 170 settles in response to bucket 100 of charge QB, the capacitors associated with the respective comparators 1-M will gather charge and present voltage which can be monitored in a fashion analogous to that described above in relation to FIG. 2. The remaining components of FIG. 4 function analogous to like components described elsewhere herein.

Figure 5:
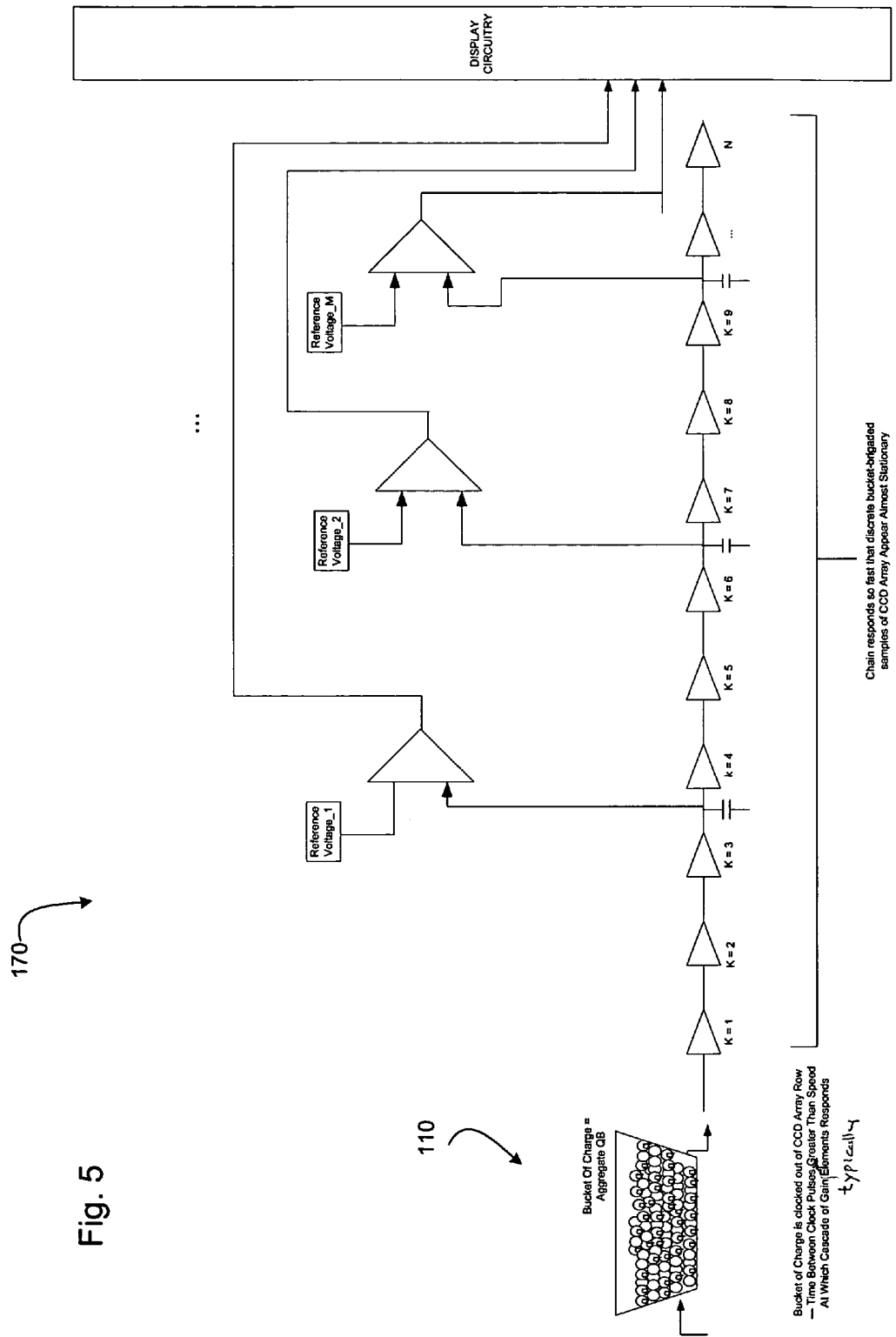
FIG. 5 shows an alternative embodiment of the structures of FIG. 3 wherein the resistors have been replaced by capacitances.

With reference now to FIG. 5, shown is an alternative embodiment of the structures of FIG. 3 wherein the resistors have been replaced by capacitances. The structures of FIG. 5 prove particularly useful in instances similar to those described in relation to FIG. 4. The components of FIG. 4 function analogous to like components described elsewhere herein.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will require optically-oriented hardware, software, and or firmware. In addition to the foregoing, those skilled in the art will appreciate that components and component settings will take into account standard design concerns, such as preventing undesired saturation of amplifiers.

The foregoing detailed description has set forth various embodiments of the devices and/or processes via the use of block diagrams, flowcharts, and examples. Insofar as such block diagrams, flowcharts, and examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs), Field Programmable Gate Arrays (FPGAs), or other integrated formats. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs.

Those skilled in the art will recognize that it is common within the art to describe devices and/or processes in the fashion set forth herein, and thereafter use standard engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, computational entities such as operating systems, drivers, and applications programs, and one or more interaction devices, such as a keyboard, a mouse, or audio component. A typical data processing system may be implemented utilizing any suitable commercially available computer system.

Those skilled in the art will recognize that it is common within the art to describe devices and/or processes in the fashion set forth herein, and thereafter use standard engineering practices to integrate such described devices and/or processes into communications systems. That is, at least a portion of the devices and/or processes described herein can be integrated into a communications system via a reasonable amount of experimentation. Those having skill in the art will recognize that a typical communications system generally includes one or more of a network operating system, a network interface card, a communications medium (e.g., electronic, optical, wireless, etc.), a data bus, and devices to couple communications media (e.g., switches, bridges, routers, repeaters, etc). A typical communications system may be implemented utilizing any suitable commercially available network components (e.g., local area network components, wide area network components, optical network components, wireless network components, virtual private network components, etc.).

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A system having an analog-to-digital converter, the system comprising:
   at least one cascade of N gain elements operably couplable with analog circuitry, the at least one cascade having at least
      N greater than or equal to a positive integer sufficient to provide said at least one cascade with a gain such that a predetermined operable signal at an input of said at least one cascade generates a signal at an output of said at least one cascade that is larger than a predetermined operable threshold value,
      an input of a first gain element of said at least one cascade operably couplable with the analog circuitry,
      a gain element of the at least one cascade having a gain larger than one by an amount such that a noise factor of said at least one cascade operating on the predetermined operable signal at the input of said at least one cascade is substantially minimized, and
      one or more output value detection circuits respectively operably coupled with one or more outputs of the N gain elements.

2. The system of claim 1, wherein the analog circuitry further comprises:
   a photo-detector array having at least one output.

3. The system of claim 2, wherein said photo-detector array having at least one output further comprises:
   at least one of a charge coupled device (CCD) array and a complementary metal oxide semiconductor (CMOS) array.

4. The system of claim 1, wherein said N greater than or equal to a positive integer sufficient to provide said at least one cascade with a gain such that a predetermined operable signal at an input of said at least one cascade generates a signal at an output of said at least one cascade that is larger than a predetermined operable threshold value further comprises:
   said N is greater than or equal to a positive integer sufficient to provide said at least one cascade with a gain such that a substantially minimally rated output signal of a photo-detector array applied to the input of said at least one cascade generates a signal at the output of said at least one cascade that is larger than the predetermined threshold value.

5. The system of claim 1, wherein said N greater than or equal to a positive integer sufficient to provide said at least one cascade with a gain such that a predetermined operable signal at an input of said at least one cascade generates a signal at an output of said at least one cascade that is larger than a predetermined operable threshold value further comprises:
   said N is greater than or equal to a positive integer sufficient to provide said at least one cascade with a gain such that a predetermined signal at an input of said at least one cascade generates a signal at the output of said at least one cascade that is larger than a substantially minimally rated input of a display circuit.

6. The system of claim 1, wherein the gain larger than one by an amount such that a noise factor of said at least one cascade operating on the predetermined operable signal at the input of said at least one cascade is substantially minimized further comprises:
   a noise factor defined as the ratio of a Signal Power to Thermal Noise ratio at the input of said at least one cascade to an amplified Signal Power to Thermal Noise ratio at the output of the at least one cascade: $(S_{input}/N_{input})/(S_{output}/N_{output})$.

7. The system of claim 1, wherein the gain larger than one by an amount such that a noise factor of said at least one cascade operating on the predetermined operable signal at the input of said at least one cascade is substantially minimized further comprises:
   a noise factor defined as a ratio of an output noise power of said at least one cascade to the portion thereof attributable to thermal noise in an input termination at standard noise temperature.

8. The system of claim 1, wherein the gain larger than one by an amount such that a noise factor of said at least one cascade operating on the predetermined operable signal at the input of said at least one cascade is substantially minimized further comprises:
   a noise factor defined as a ratio of actual output noise to that which would remain if the at least one cascade itself did not introduce noise.

9. The system of claim 1, wherein the gain larger than one by an amount such that a noise factor of said at least one cascade operating on the predetermined operable signal at the input of said at least one cascade is substantially minimized further comprises:
   the gain larger than one but less than 1.001.

10. The system of claim 1, wherein the gain larger than one by an amount such that a noise factor of said at least one cascade operating on the predetermined operable signal at the input of said at least one cascade is substantially minimized further comprises:
the gain larger than one but less than 1.01.

11. The system of claim 1, wherein the gain larger than one by an amount such that a noise factor of said at least one cascade operating on the predetermined operable signal at the input of said at least one cascade is substantially minimized further comprises:
the gain of a gain element is larger than one by an amount that is practicably small such that the noise contribution to the low noise amplifier from a gain element is substantially minimized.

12. The system of claim 1, wherein said gain element of the at least one cascade having a gain larger than one by an amount such that a noise factor of said at least one cascade operating on the predetermined operable signal at the input of said at least one cascade is substantially minimized further comprises:
an impact ionization-based amplifier having a gain larger than one by an amount such that the noise factor of said at least one cascade operating on the predetermined signal at the input of said cascade is substantially minimized.

13. The system of claim 12, wherein said impact ionization-based amplifier further comprises:
a solid state electron multiplying amplifier.

14. The system of claim 1, wherein said gain element of the at least one cascade having a gain larger than one by an amount such that a noise factor of said at least one cascade operating on the predetermined operable signal at the input of said at least one cascade is substantially minimized further comprises:
an over-biased amplifier.

15. The system of claim 1, wherein said gain larger than one by an amount such that a noise factor of said at least one cascade operating on the predetermined operable signal at the input of said at least one cascade is substantially minimized further comprises:
the gain larger than one by an amount such that the noise factor of said at least one cascade operating on the predetermined signal at the input of said at least one cascade is less than 1.2.

16. The system of claim 1, wherein said one or more output value detection circuits respectively operably coupled with one or more outputs of the N gain elements further comprises:
one or more comparators respectively operably coupled with one or more outputs of the N gain elements.

17. The system of claim 1, wherein said one or more output value detection circuits respectively operably coupled with one or more outputs of the N gain elements further comprises:
M comparators operably coupled with M gain elements of the at least one cascade, wherein M is an integer that is smaller than N; and
M reference values operably coupled with said M comparators.

18. A method of constructing a system having an analog to digital converter with N gain elements, said method comprising:
configuring a first gain element such that an input of the first gain element is operable to receive an input signal;
connecting an output of a k'th gain element to an input of a k+1'th gain element, wherein k is an integer that is at least 1;
connecting one or more outputs of the N gain elements respectively to one or more value detection circuits;
configuring an N'th gain element such that an output of the N'th gain element is operable to generate an output signal; and
N being a positive integer such that a ratio between the output signal and the input signal is larger than a predetermined threshold gain when the input signal is received at the input of the first gain element.

19. The method of claim 18, wherein at least one gain element has a gain larger than one but less than 1.001.

20. The method of claim 18, wherein at least one gain element has a gain larger than one but less than 1.01.

21. The method of claim 18, wherein at least one gain element has a gain generated based on an impact ionization process.

22. The method of claim 18, wherein at least one gain element has a gain that is provided by over biasing the gain element.

23. The method of claim 18, wherein at least one gain element comprises a solid state electron multiplying amplifier.

24. The method of claim 18, wherein the at least one gain element has a gain larger than one by an amount such that a noise factor of the N gain elements is practicably minimized.

25. The method of claim 18, wherein the one or more value detection circuits comprise one or more comparators.

26. A method of digitizing an input signal with N gain elements, said method comprising:
receiving the input signal at an input of a first gain element;
transmitting a signal from an output of a k'th gain element to an input of a k+1'th gain element, wherein k is an integer that is at least 1;
transmitting signals from one or more outputs of the N gain elements respectively to one or more value detection circuits;
generating an output signal at an output of an N'th gain element; and
N being a positive integer such that a ratio between the output signal and the input signal is larger than a predetermined threshold gain.

27. The method of claim 26, wherein at least one gain element has a gain larger than one but less than 1.001.

28. The method of claim 26, wherein at least one gain element has a gain larger than one but less than 1.01.

29. The method of claim 26, wherein at least one gain element has a gain generated based on an impact ionization process.

30. The method of claim 26, wherein at least one gain element has a gain that is provided by over biasing the gain element.

31. The method of claim 26, wherein at least one gain element comprises a solid state electron multiplying amplifier.

32. A system comprising:
a photo-detector array having at least one output; and
at least one cascade of N gain elements operably coupled with said photo-detector array, having at least
N greater than or equal to a positive integer sufficient to provide said at least one cascade with a gain such that a predetermined signal at an input of said at least one cascade generates a signal at an output of said at least one cascade that is larger than a predetermined threshold value, an input of a first gain element of said at least one cascade operably coupled with an output of said photo-detector array, a gain element of the at least one cascade having a gain larger than one by an amount such that a noise factor of said at least one cascade operating on the predetermined signal at the input of said at least one cascade is substantially minimized, and one or more output value detection circuits respectively operably coupled with one or more outputs of the N gain elements.

33. A method of analog-to-digital conversion, said method comprising:

detecting that a first gain element output of N gain elements in a cascade is below a first predefined threshold; and determining a digital conversion value in response to a detection that a second gain element output of the N gain elements in the cascade is above a second predefined threshold greater than the first predefined threshold.

34. The method of claim 33, wherein said determining a digital conversion value in response to a detection that a second gain element output of the N gain elements in the cascade is above a second predefined threshold greater than the first predefined threshold comprises:

obtaining a first bound by dividing the first predefined threshold by an aggregate gain between the at first gain element output and a defined analog input;

obtaining second bound by dividing the second predefined threshold by an aggregate gain between the second gain element output and the defined analog input;

determining a signal value bounded by the first and the second bound; and obtaining the digital conversion value in response to the signal value.

35. The method of claim 34, wherein said obtaining the digital conversion value in response to the signal value comprises:

designating the signal value as the digital conversion value.

36. The method of claim 34, wherein said obtaining the digital conversion value in response to the signal value comprises:

quantizing the signal value.

37. The method of claim 34, wherein said obtaining the digital conversion value in response to the signal value comprises:

digitizing the signal value.

38. A system having an analog-to-digital converter, the system comprising:

at least one cascade of N gain elements operably couplable with analog circuitry, the at least one cascade having at least N greater than or equal to a positive integer sufficient to provide said at least one cascade with a gain such that a predetermined operable signal at an input of said at least one cascade generates a signal at an output of said at least one cascade that is larger than a predetermined operable threshold value, an input of a first gain element of said at least one cascade operably couplable with the analog circuitry, and one or more output value detection circuits respectively operably coupled with one or more outputs of the N gain elements.

39. The system of claim 38, wherein said at least one cascade of N gain elements further comprises:

an impact ionization-based amplifier having a gain larger than one by an amount such that the noise factor of said at least one cascade operating on the predetermined signal at the input of said cascade is substantially minimized.

40. The system of claim 39, wherein said impact ionization-based amplifier further comprises:

a solid state electron multiplying amplifier.

41. The system of claim 38, wherein said at least one cascade of N gain elements further comprises:

an over-biased amplifier.

* * * * *